United States Patent [19]
Johnson

[11] Patent Number: 5,432,373
[45] Date of Patent: Jul. 11, 1995

[54] MAGNETIC SPIN TRANSISTOR

[75] Inventor: Mark B. Johnson, Holmdel, N.J.

[73] Assignee: Bell Communications Research, Inc., Livingston, N.J.

[21] Appl. No.: 346,329

[22] Filed: Nov. 29, 1994

Related U.S. Application Data

[63] Continuation of Ser. No. 990,962, Dec. 15, 1992, abandoned.

[51] Int. Cl.[6] .............................................. H01L 27/22
[52] U.S. Cl. .................................. 257/421; 360/113; 324/249; 324/252
[58] Field of Search ............... 257/422, 421; 360/113, 360/126; 324/252, 246, 249

[56] References Cited

U.S. PATENT DOCUMENTS

| | | | |
|---|---|---|---|
| 4,823,177 | 4/1989 | Prinz et al. | 257/421 |
| 4,949,039 | 8/1990 | Grünberg | 324/252 |
| 5,005,096 | 4/1991 | Krounbi et al. | 360/113 |
| 5,134,533 | 7/1992 | Friedrich et al. | 360/113 |
| 5,206,590 | 4/1993 | Dieny et al. | 324/252 |
| 5,251,088 | 10/1993 | Coutellier et al. | 360/113 |

FOREIGN PATENT DOCUMENTS

| 3-200084 | 9/1991 | Japan | 324/252 |
|---|---|---|---|

OTHER PUBLICATIONS

Hayt, Jr., *Engineering Electromagnetics*, 1989, pp. 278–282.
J. M. Daughton, "Magnetoresistive memory technology," Thin Solid Films, 1992, vol. 216, pp. 162–168.
M. Johnson et al., "Coupling of electronic charge and spin at a ferromagnetic–paramagnetic metal interface," *Physical Review B*, 1988, vol. 37, pp. 5312–5325.
M. Johnson et al., "Spin-injection experiment," Physical Review B, 1988, vol. 37, pp. 5326–5335.

*Primary Examiner*—Jerome Jackson
*Assistant Examiner*—Courtney A. Bowers
*Attorney, Agent, or Firm*—Leonard Charles Suchyta; James W. Falk

[57] ABSTRACT

A magnetic spin transistor, usable as a memory cell, magnetic pick-up head, or a current switch, that includes a trilayer planar structure of a conductive, non-ferromagnetic layer (16) sandwiched between two ferromagnetic layers (12, 14) of different coercivities. A biasing current pumped between one of the ferromagnetic layers and the nonferromagnetic layers produces a voltage on the other ferromagnetic layer. The polarity of the voltage depends on the relative magnetic polarization of the two ferromagnetic layers. As a memory cell, current passing through adjacent lines magnetize the ferromagnetic layer of lower coercivity. As a magnetic pick-up head, an adjacent magnetic recording track supplies the magnetic field sufficient to switch the lower-coercivity ferromagnetic layer.

18 Claims, 11 Drawing Sheets 5,432,373

MAGNETIC SPIN TRANSISTOR

This application is a continuation of application Ser. No. 07/990,962, filed Dec. 15, 1992, abandoned.

SPECIFICATION

1. Field of the Invention

The invention relates generally to ferromagnetic electronic devices. In particular, the invention relates to such devices, including memories, sensors, and gates, relying upon electron spin coupling across a thin layer.

2. Background Art

Two competing properties affect the design of new electronic devices, particularly memories. The devices must be as small as practically possible. Small size reduces the fabrication cost for large number of memory cells, and also reduces the power consumed per cell, other factors being equal. However, a desirable but generally countervailing property is non-volatility of the memory, that is, it retains its memory state even after the power has been removed from the cell. Non-volatile memory has the operational advantage of being unaffected by power outages. Also, for infrequently used memory, it offers considerable savings in average power.

A recently developed type of non-volatile memory relies upon magnetoresistance. One type, disclosed by Daughton in "Magnetoresistive memory technology," *Thin Solid Films*, vol. 216, 1992, pp. 162–168, sandwiches a nonferromagnetic conductive layer between two ferromagnetic layers. Current lines adjacent to the memory cell create a magnetic field which switches the magnetization direction of the ferromagnetic layers between two stable states. The direction of the switched magnetic state is tested by passing a current along the length of the conductive layer. The magnetoresistive effect causes the resistance of the conductive layer to depend upon the magnetic field impressed by the bistable ferromagnetic layers. A problem with this device is that the change of current (or voltage if a current source is used) induced by the bistable magnetic field is only a few percent of the current (voltage) necessary to read it. That is, this device has a poor signal-to-noise ratio. The magnetoresistive effect has also been used in recently introduced magnetic read heads in which the magnetic field is supplied by the magnetic recording medium rather than an adjacent ferromagnetic layer.

SUMMARY OF THE INVENTION

The invention may be summarized as a magnetic spin transistor in which a thin layer of nonferromagnetic material is sandwiched between two ferromagnetic layers. The nonferromagnetic layer is thin enough that the spin-polarized chemical potential of one ferromagnetic layer is coupled to that of the other ferromagnetic layer via a nonequilibrium spin population in the nonferromagnetic layer. Electrical biasing current passes from the first ferromagnetic layer to the nonferromagnetic layer. The resultant voltage produced between the second ferromagnetic layer and the nonferromagnetic layer depends upon the relative spin polarizations of the two ferromagnetic layers, that is, their relative magnetization directions. Preferably, the two ferromagnetic layers have differing coercivities so that an externally applied magnetic field switches one but not the other. The switch can be implemented as a magnetic sensor, for which a magnetic storage medium supplies the magnetic field. It can also be implemented as a memory cell in which current selectively passing through an electrical line over the cell provides the magnetic field. Yet further, it can be implemented as a current switch.

DETAILED DESCRIPTION OF THE PREFERRED EMBODIMENTS

Figure 1:
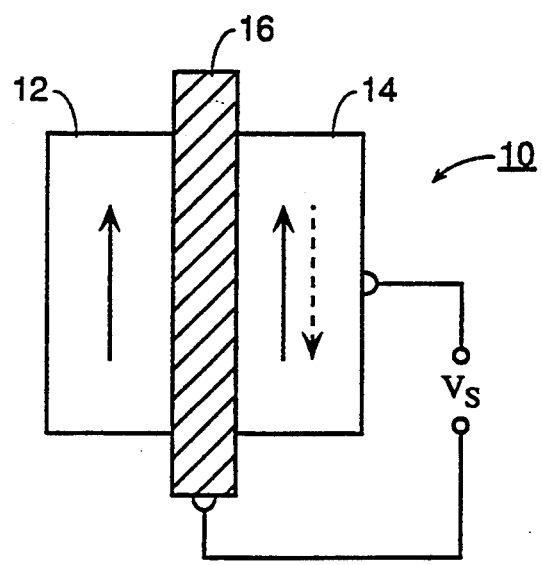
FIG. 1 is a cross-sectional view of a trilayer structure illustrating the operation of the invention.

Many of the embodiments of the invention rely on a trilayer structure 10, illustrated schematically in FIG. 1. It includes two electrically conductive ferromagnetic layers 12 and 14 separated by a thin conductive paramagnetic layer 16. The simple illustrated structure is presented for ease of understanding. Operational considerations will cause actual devices to have a significantly different structure. By a conductive paramagnetic material is meant a material having electron levels that are not significantly affected by the electron spin so that there is little splitting between the spin sub-bands. That is, the equilibrium energy levels for a paramagnet are substantially the same for the two electronic spins. The electrons (or holes) are good conductors of electrical current. Most metals and semiconductors conform to these requirements. The thickness of the paramagnetic layer 16 should be less than or at least of the order of the spin depth $$\delta_s = \sqrt{2DT_2}, \tag{1}$$

where D is the electronic diffusion coefficient and $T_2$ is its spin relaxation time. This requirement arises because the spin coupling falls off exponentially with distance as normalized by the spin depth. As a result, a spin-polarized electron can diffuse across the paramagnetic layer 16 while maintaining its spin polarization.

Figure 2:
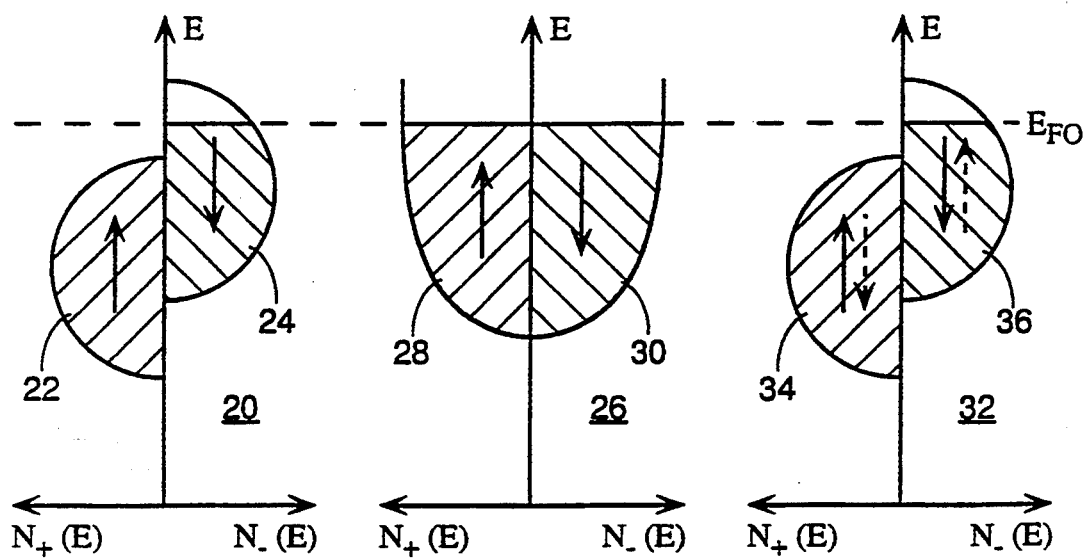
FIG. 2 illustrates the electronic band structure for each of the layers of the structure of FIG. 1 when it is not biased.

The magnetic properties of the structure 10 may be described in terms of electron spin distributions. As illustrated in the simplified band structure 20 of FIG. 2 for the first ferromagnetic layer 12, the energy densities or distributions $N_+$ and $N_-$ for the spin-up sub-band 22 and the spin-down sub-band 24 are both elliptical as a function of electron energy E. However, in this simple model, the net ferromagnetic moment or magnetic exchange of the material is manifested by the spin-up sub-band 22 being filled while the spin-down sub-band 24 is only partially filled. Specifically, it is filled only up to an energy level determined by the electrochemical (chemical) potential, which equals an overall Fermi level $E_{F0}$. On the other hand, in the conductive paramagnetic layer 16, the band structure 26 consists of parabolic sub-bands 28 and 30 for both the spin-up and spin-down electrons. In the absence of an externally applied field or current, both paramagnetic sub-bands 28 and 30 are equally filled up to the Fermi level $E_{F0}$. The band structure 32 for the second ferromagnetic layer 14 has spin-up and spin-down sub-bands 34 and 36 like the sub-bands 22 and 24 of the first ferromagnetic layer 12 as long as that layer 14 remains isolated. The illustrated sub-bands assume that the two ferromagnetic layers 12 and 14 have parallel spin polarizations, that is, parallel magnetizations. If they were antiparallel, there would be little change beyond identifying the spin directions of the two sub-bands 34 and 36. In the absence of an externally applied field or current, the overall Fermi energy $E_{F0}$ equals the chemical potential of all three layers 12, 14, and 16, and, in particular, the potential $V_s$ of the second ferromagnetic layer 14 relative to the paramagnetic layer 16 is zero.

Figure 3:
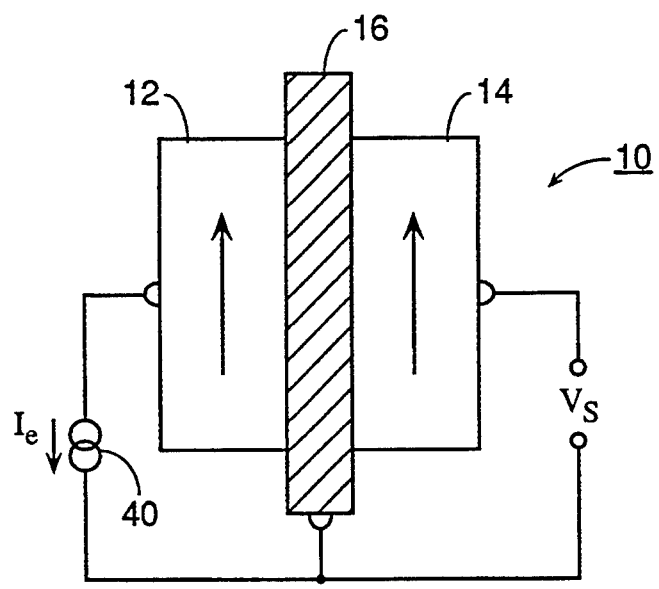
FIG. 3 is a cross-sectional view of the trilayer structure of FIG. 1 when it is biased and has parallel magnetization in its ferromagnetic layers.
Figure 4:
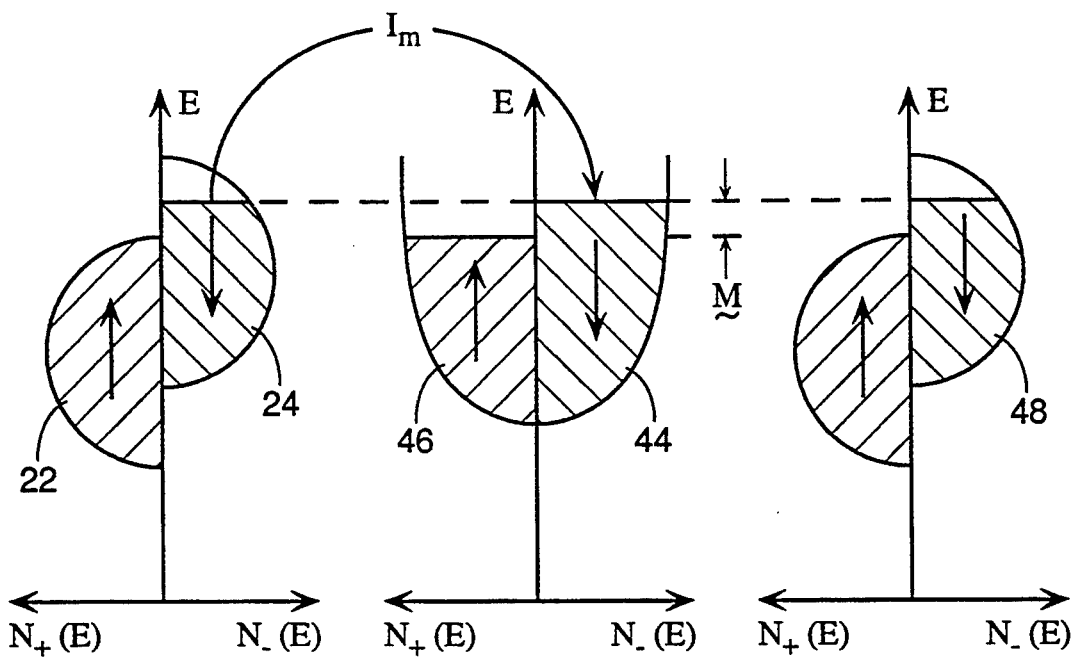
FIG. 4 illustrates the band structure of the structure of FIG. 3.

If, illustrated in FIG. 3, an electrical current source 40 pumps a bias current $I_e$ between the first ferromagnetic layer 12 and the paramagnetic layer 16, spin-polarized electrons are pumped from near the chemical potential of the spin-down sub-band 26, illustrated in FIG. 4, to a corresponding spin-down sub-band 44 of the ferromagnetic layer 16. In this simplified model, the minority-spin, spin-up sub-band 22 is too far removed from the Fermi level to contribute to the current. As a result, the electrical current is spin polarized. The spin-down electrons flow only into the spin-down sub-band 44 and not into the spin-up sub-band 46 because the Pauli exclusion principle requires separate densities of state for each spin in each material and further because the thickness of the paramagnetic layer 16 is less than the spin depth $\delta_s$ so that no mechanism exists during the electrons' transport into the paramagnetic layer 16 for their two spin states to mix. This effect has been disclosed by Johnson et al. in "Coupling of electronic charge and spin at a ferromagnetic-paramagnetic metal interface," *Physical Review B*, vol. 37, 1988, pp. 5312–5325 and in "Spin-injection experiment," ibid., pp. 5326–5335. Due to the finite spin-relaxation time $T_2$, the spin-down chemical potential in the ferromagnetic layer 16 is raised in steady-state conditions, and charge neutrality dictates a corresponding lowering of the spin-up chemical potential. The chemical potential of the two spin-down sub-bands 24 and 44 become aligned at a level above the equilibrium value of their chemical potential, which was $E_{F0}$.

Associated with the electrical current $I_e$, a magnetic current $$I_m = \frac{\eta_1 \beta I_e}{e} \quad (3)$$

flows from the first ferromagnetic layer 12 to the paramagnetic layer 16, where $\beta$ is the Bohr magneton and e is the positive electronic charge. The band-structure factor $\eta_1$ describes the efficiency of conduction of the spin sub-bands of the first ferromagnetic layer 12 across the interface with the paramagnetic layer and is defined as $$\eta = \frac{J_+ - J_-}{J_+ + J_-}, \quad (4)$$

where $J_+$ is the majority-spin current density and $J_-$ is that for the minority spin. The band-structure factor is equal to one for the simplified band structure 20, but is reduced when both sub-bands contribute to conduction and may even assume fractional negative values when the minority-carrier spin sub-band dominates the conduction. When the paramagnetic layer is metallic, the band-structure factor is almost totally dependent upon the details of the ferromagnetic band structure. Equation (3) incorporates several simplifying assumptions which do not detract from the essential concepts of the invention. In steady state, the magnetic current $I_m$ creates a net nonequilibrium magnetization density $$M = \frac{I_m T_2}{A \cdot d} \quad (5)$$

in the paramagnetic layer 16, where d is the thickness of the paramagnetic layer 16 and A is the area of contact between it and the first ferromagnetic layer 12.

Figure 5:
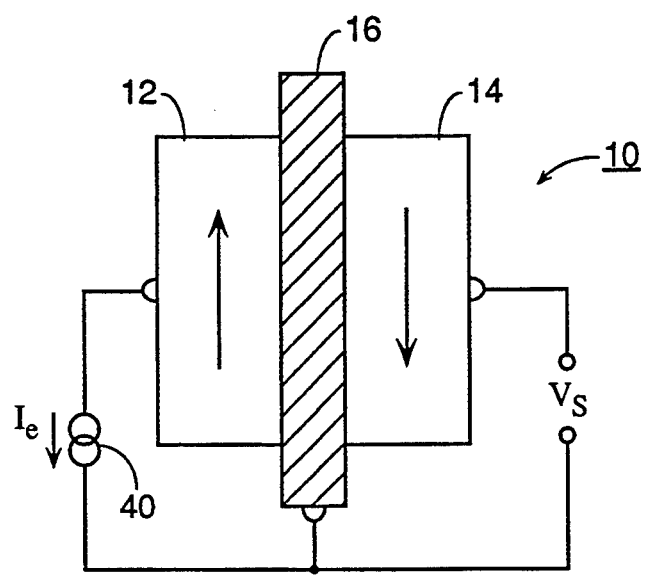
FIG. 5 is a cross-sectional view of the trilayer structure of FIG. 1 when it is biased and has antiparallel magnetization in its ferromagnetic layers.
Figure 6:
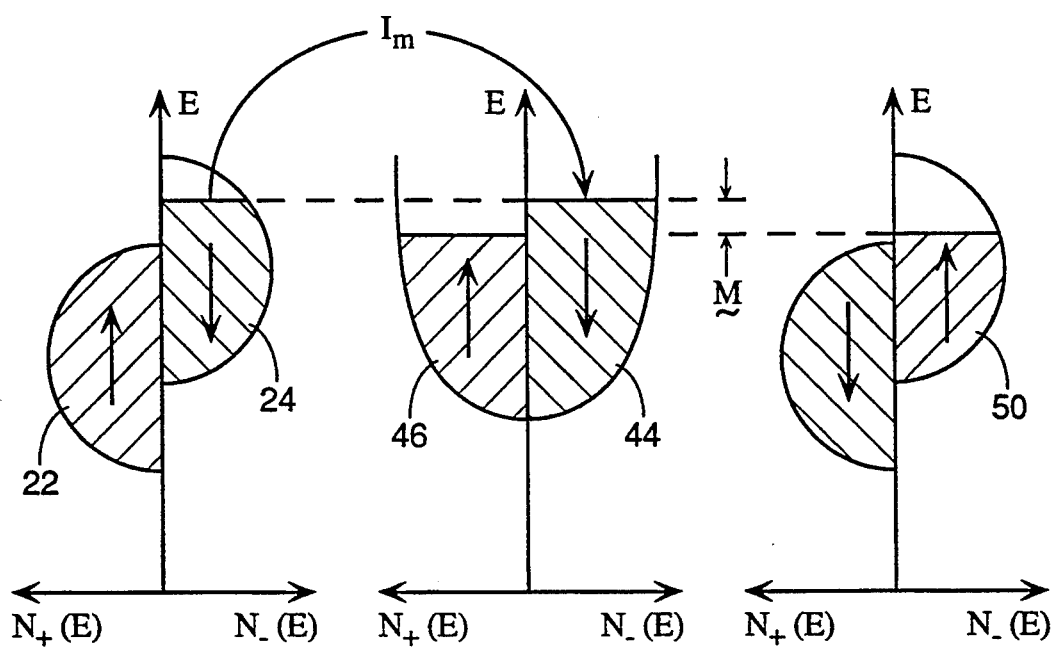
FIG. 6 illustrates the band structure of the trilayer structure of FIG. 5.

The effect of the displaced paramagnetic chemical potentials upon the second ferromagnetic layer 14 depends on its magnetization direction relative to that of the first ferromagnetic layer 12. Assuming no current flow across the interface between the paramagnetic layer 16 and the second ferromagnetic layer 14, the chemical potential of the untilled spin sub-band in the second ferromagnetic layer 14 aligns with the chemical potential or Fermi level in the corresponding paramagnetic sub-band. In the situation, as illustrated in FIGS. 3 and 4, where the magnetization directions of the first and second ferromagnetic layers 12 and 14 are parallel, the chemical potential of the spin-down sub-band 48 in the second ferromagnetic layer 14 aligns with the raised Fermi energy of the spin-down sub-band 44 in the paramagnetic layer 16. On the other hand, if, as illustrated in FIGS. 5 and 6, the magnetization directions of the first and second ferromagnetic layers 12 and 14 are antiparallel, it is the spin-up band 50 in the second ferromagnetic layer 14 that remains untilled, and its chemical potential aligns with the depressed spin-down Fermi energy of the spin-up sub-band 46 in the paramagnetic layer 16. In the configuration of FIGS. 1–6, the electrical potential of the paramagnetic layer 16 is measured at a point far beyond a spin depth from the first ferromagnetic layer 12. Hence, its measured potential, exclusive of any resistive drop, is the unperturbed Fermi level, that is, the average of the chemical potentials of the spin-up and spin-down sub-bands 44 and 46. This averaging occurs even for the electrode configuration to be described later for FIG. 8.

The rise or fall of the potential of the first ferromagnetic layer 12 relative to the paramagnetic layer 16 is difficult to measure because it is only part of the total voltage drop of the circuit, including resistive drops at the interface between the first ferromagnetic layer 12 and the paramagnetic layer 16. Nonetheless, the effect can be detected and is used in other embodiments to be discussed later. On the other hand, the rise or fall of the potential $V_s$ of the second ferromagnetic layer 14 relative to the paramagnetic layer 16 can be as large as millivolts and is more readily detected because no current need flow through the interface between the two layers 14 and 16 if a high-impedance voltage measuring device measures $V_s$. The potential $V_s$ of the second ferromagnetic layer 14 is of different polarity with respect to the paramagnetic layer 16 dependent on whether the magnetization directions of the two ferromagnetic layers 12 and 14 are parallel or antiparallel.

The behavior of the circuit 10 can be characterized by a transimpedance $$R_s \equiv \frac{V_s}{I_e} = \pm \frac{3\eta_1 \eta_2 T_2 E_F}{2e^2 n \cdot A \cdot d}. \tag{6}$$

where n is the conduction electron density, $\eta_2$ is the band-structure factor for the second ferromagnetic layer 14, and $E_F$ is the average Fermi energy of the paramagnetic layer 16. This equation again has a number of simplifying assumptions, including the free-electron expression for the magnetic susceptibility of the paramagnetic layer 16 and no resistive potential drop. A configuration to be shown later essentially eliminates the resistive drop. Also, this equation was derived for the case where the paramagnetic layer 16 is a metal. Similar expressions are available for where it is a semiconductor or a two-dimensional electron gas.

The inverse scaling of the signal $V_s$ with the sample volume A·d is unique and important. It distinguishes this device from magnetoresistive devices and promises an increase of sensitivity as devices are scaled down. The inventive device may be characterized as a transistor because of the transimpedance linking the biasing current $I_e$ and the sensed voltage $V_s$ measured across different pairs of terminals. Further, the device when used as a current switch can exhibit current gains as large as 1000.

In very general terms, the structure 10 can be used either as a memory cell, a current switch, or a magnetic field detector, either of binary or analog magnetic field. As a memory cell, local magnetic fields are used to magnetize the second ferromagnetic layer 14 in one of two orientations relative to the first ferromagnetic layer 12. Either orientation is stable in the absence of any applied field or current. That is, it acts as a non-volatile memory. The memory is read by applying the read current $I_e$ to the cell. The voltage $V_s$ indicates the stored state of the memory cell. The reading process is non-destructive.

Figure 7:
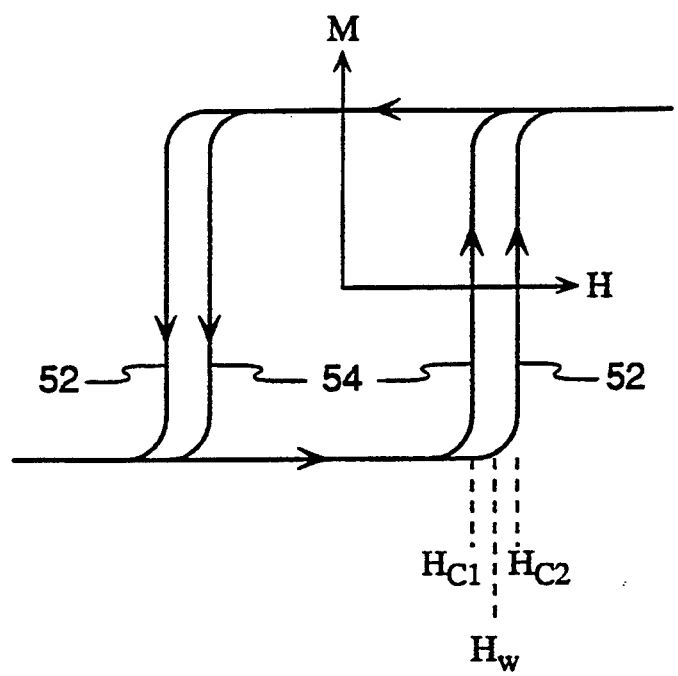
FIG. 7 illustrates idealized hysteresis curves for two materials of differing coercivity.

As a magnetic detector for a binary magnetic storage medium, the two ferromagnetic layers 12 and 14 are made with different coercivities so that they switch between the two opposed magnetic states at different levels of magnetic field. Two idealized magnetic hysteresis curves 52 and 54 are illustrated in FIG. 7 for materials of different coercivities. The first ferromagnetic layer 12, which accepts the biasing current $I_e$, has a hysteresis curve 52 and switches magnetic state at a coercivity $H_{c2}$ while the second ferromagnetic layer 14, on which the voltage $V_s$ is measured, has a hysteresis curve 54 and switches at a lower coercivity $H_{c1}$. An applied working magnetic field $H_w$ is chosen to lie between $H_{c1}$ and $H_{c2}$. The magnetic storage medium used in conjunction with the sensor is impressed with a series of magnetic domains of two magnetic values for representing digital data. These domains impress a bipolar working magnetic field $\pm H_w$ on the second ferromagnetic layer 14. Thus, the domains can switch the second ferromagnetic layer 14 but not the first ferromagnetic layer 12. While the bias current $I_e$ is spin-biasing the detector of the invention, the detector is moving relative to the magnetic storage medium. The value of the voltage $V_s$ indicates the magnetic state of the adjacent domain of the magnetic medium.

The above description has been relatively general. Numerous improvements may be made. The ground terminal for the measurement of $V_s$ illustrated in the prior drawings is disadvantageous because of voltage drops in the circuit. A better configuration, illustrated in perspective in FIG. 8, includes a ferromagnetic base member 60 collinear with a metallic base member 62. A paramagnetic member 64 vertically contacts on its two end portions the two base member 60 and 62. Both a metallic surface member 66 and a ferromagnetic surface member 68 vertically contact the paramagnetic member 64 over the ferromagnetic base member 60. The metallic surface member 66 need only be an alloying area of the paramagnetic member 64. When the structure is used as a memory cell and is being read, a pulse of bias current $I_e$ supplied by leads 70 and 72 is passed between the base members 60 and 62 through the paramagnetic member 64 while a pulse of the voltage $V_s$ is measured between two leads 74 and 76 connected to the two surface members 66 and 68. The voltage leads 74 and 76 in turn are connected to voltage measuring means such as a differential amplifier 78 outputting to a commonly connected word line 80. Alternatively, passive coupling means, possible in pulsed operation, include a load resistor connected across the voltage leads 74 and 76 and a capacitor coupling the ferromagnetic voltage lead 66 to the word line 80. The current leads 70 and 72 can be connected in some serial fashion to a bit line arranged perpendicularly to the word line 80. It is of course envisioned that a two-dimensional array of such cells be formed as an integrated circuit on a chip substrate.

Figure 8:
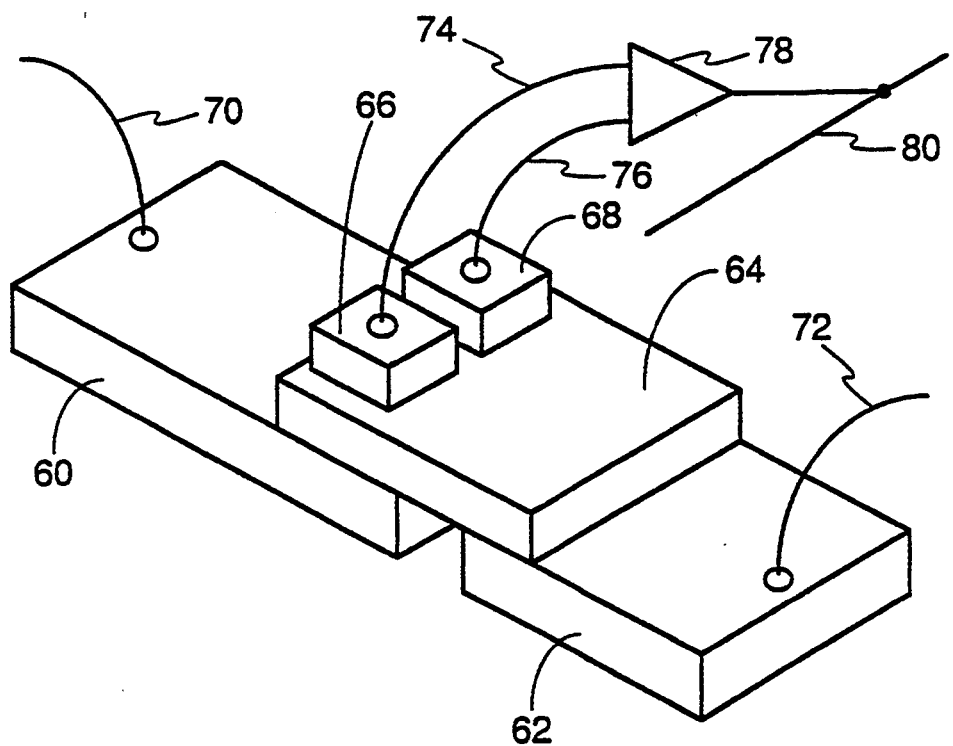
FIG. 8 is a perspective view of a cell of the invention.
Figure 9:
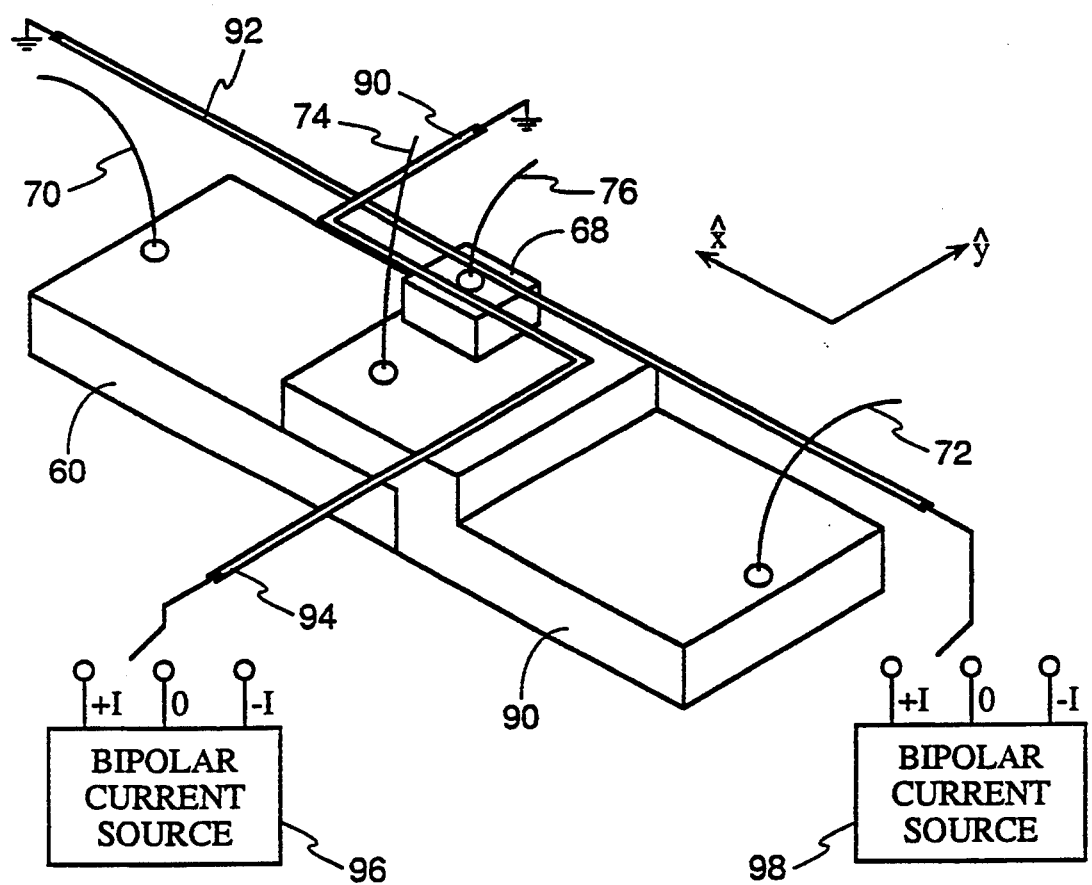
FIG. 9 is a perspective view of the cell of FIG. 8 with additional writing circuitry.

The description of FIG. 8 involves the reading of the memory cell. The cell can be written using the structure illustrated in FIG. 9 in which a single metal member 90 serves as both the paramagnetic layer and its base member and in which the metal voltage lead 74 is connected directly to the paramagnetic metal member 90 above the ferromagnetic base member 60. The coercivity of the ferromagnetic surface member 68 is less than that of the ferromagnetic base member 60, which is initially poled with a large magnetic field so it is magnetized in the y direction. Two poling leads 92 and 94 are laid over the ferromagnetic surface member 68 in parallel to each other and perpendicularly to the y direction. However, away from the ferromagnetic surface member 68, they run perpendicularly along the rows and columns of the array. One poling lead 92 could be replaced by a serial connection through the ferromagnetic base member 60 and the paramagnetic member 90. The two poling leads 92 and 94 are connected to respective bipolar current sources 96 and 98 which can be independently switched to provide $+I$, $-I$, and no current. The current sources 96 and 98 impress respective finite or zero current pulses on the two poling leads 92 and 94, which thereby produce two pulses of respective magnetic fields, if finite, that are parallel or antiparallel to the y direction in the vicinity of the ferromagnetic surface member 68. Each field strength is approximately $H_w/2$. The magnetic field magnitude and its direction y or $-y$ depends on the directions of both currents through the respective poling lead 92 or 94. Neither magnetic field is sufficient to switch even the lower-coercivity ferromagnetic surface member 68; however, if the two magnetic fields are parallel to each other, the lower-coercivity ferromagnetic surface member 68 will switch but the higher-coercivity ferromagnetic base member 60 will not switch. Thus, to write a particular cell in a two-dimensional array, the two poling leads 92 and 94 crossing at that cell are poled with current pulses of the same polarity, corresponding to the polarities of the created magnetic field, and the polarity is chosen to produce the desired one of the two stable ferromagnetic states. Only that cell is switched. If the ferromagnetic material exhibits both a hard and a soft magnetization direction, the two poling leads can be made perpendicular to each other and carry different currents.

Figure 10:
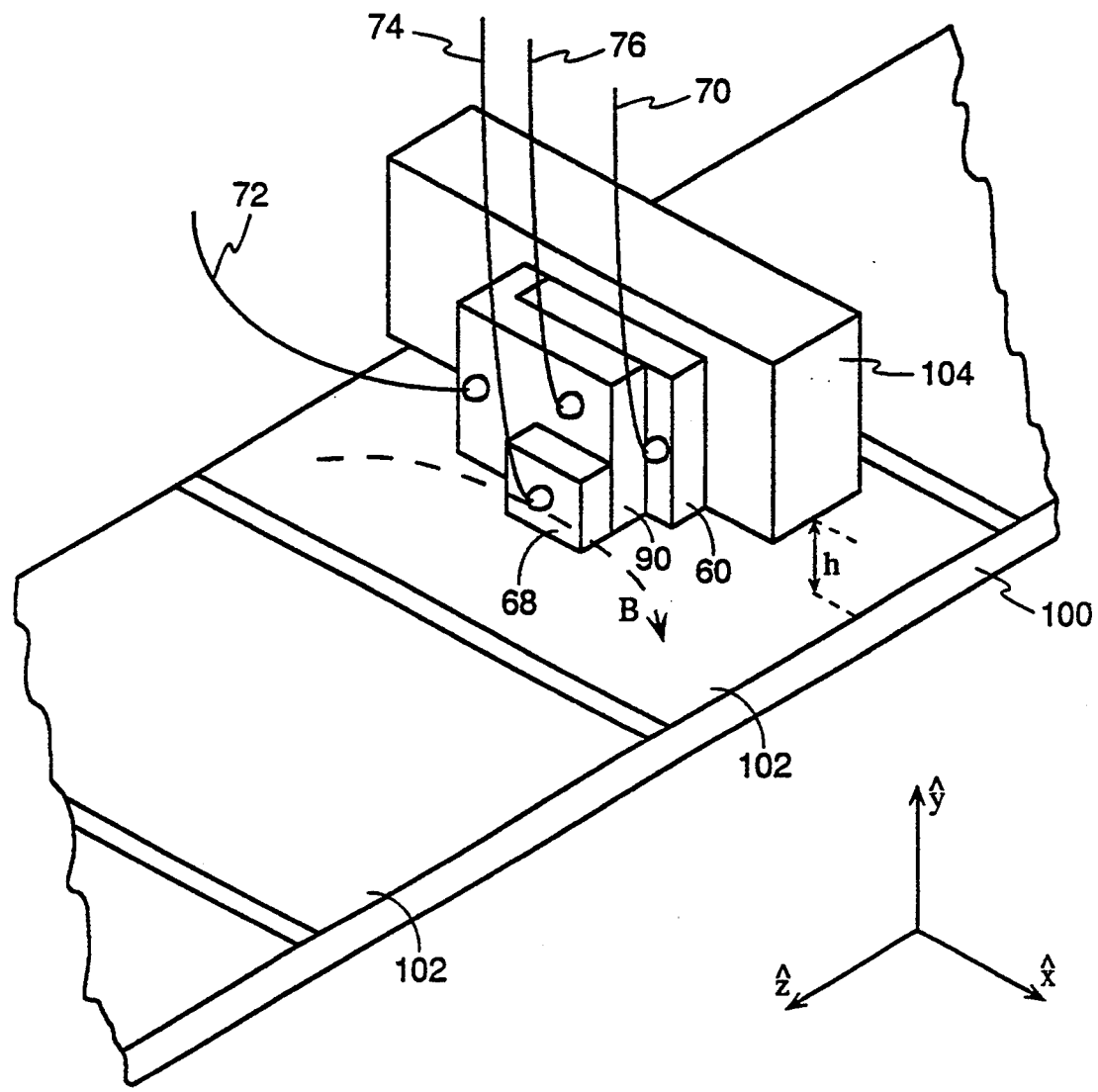
FIG. 10 is a perspective view of an embodiment of the invention being used as a sensor.

The spin transistor of the invention can be used as a magnetic field sensor, particularly for use in reading binary magnetic storage media such as tapes and disks although it can be adapted to read analog magnetic fields as well. As illustrated in perspective in FIG. 10, a magnetic recording medium 100 moving along the z direction is recorded in tracks with a series of magnetic domains 102. This figure shows longitudinal recording in which each domain 102 is recorded with a respective magnetic field along the $\pm x$ directions. Other magnetic configurations are possible. The sensor of the invention is mounted on a nonmagnetic substrate 104 positioned a distance h above the track. In the disk configuration, the magnetic recording medium 100 is a circular disk mounted at its center on an unillustrated spindle which rotates the disk beneath the sensor, and the substrate 104 is held by a pickup arm at the height h above the disk. In the tape configuration, the magnetically recorded tape is pressed against the sensor as the tape is run between reels. Aerodynamic effects can be used for precise determination of the height, and magnetic shields can be used to focus the magnetic field in a small area near the sensor. The sensor includes the ferromagnetic base member 60, the paramagnetic metal member 90, and the ferromagnetic surface member 68, all having their lower edges also positioned a distance h above the magnetic track. The ferromagnetic base member 60 has a higher coercivity $H_{c2}$ than the coercivity $H_{c1}$ of the ferromagnetic surface member 68. The higher-coercivity ferromagnetic base member 60 is initially poled with a large magnetic field to be magnetized in the x direction. The magnetic domains 102 produce a leakage magnetic field B having a working field strength $H_w$ falling between $H_{c1}$ and $H_{c2}$ so that they can switch the ferromagnetic surface member 68 but not the ferromagnetic base member 60.

In operation, a DC bias current $I_e$ is passed between the bias leads 70 and 72 while the recording medium 100 travels below the sensor. Voltage monitoring means connected to the voltage leads 74 and 76 detect a bipolar signal $V_s$, where the polarity of the signal is determined by the polarity of the magnetic signal recorded in the magnetic domains 102. Noise discrimination becomes much less of a problem because the voltage signals are relatively large and the discrimination level can be fixed at zero.

The sensor may be easily adapted to vertical magnetization of the domains 102 by initially poling the ferromagnetic base member 60 along the y direction. The more common longitudinal magnetization of the domains 102 along the z direction can be accommodated by rotating the sensor by 90°. Of course, the sensor could easily be fabricated in a linear array of such sensors to read a multi-track recording medium.

The device of the invention can also be used as a current switch in which the relative magnetizations of the ferromagnetic layers determine whether a current input to one ferromagnetic layer will be output on the paramagnetic layer or the other ferromagnetic layer. It is thus analogous to a bipolar transistor having a large current gain and is useful as an emitter-follower.

EXPERIMENTS

A series of experimental structures were fabricated and then tested. In four of the samples, both of the ferromagnetic layers were composed of permalloy. In a fifth sample, the first ferromagnetic layer was permalloy while the second was cobalt. In all samples, the paramagnetic layer was gold.

A sapphire substrate was covered with a layer of Ti for adhesion. Electron-beam evaporation from a single source of $Ni_{79}Fe_{21}$ deposited a lower permalloy layer to a thickness of 70 nm. The permalloy layer and accompanying adhesion layer were patterned into a large area for a contact pad and having an edge near which the active device was to be formed. An insulating layer of $Al_2O_3$ was deposited over the permalloy and defined with a lift-off process to have two adjacent windows through it of area $10^{-2}$ mm$^2$ at equal distances from the edge of the permalloy and having their edges separated by 0.2 mm. The insulating layer extended over the edge. The permalloy was cleaned with an Ar ion mill, and gold was thermally deposited to a variable thickness to provide the paramagnetic layer. Gold was chosen to enable the first measurement of spin lifetime in gold. The gold was defined to a large area both for the area of the windows and for another contact pad. The gold extended over the permalloy edge and included a small area overlying the permalloy edge. Another $Al_2O_3$ deposition and liftoff defined a set of windows in the second $Al_2O_3$ insulating layer overlying the first set of windows. A shadow mask was positioned over one of the exposed windows, and the upper ferromagnetic layer having a diameter of about 0.2 mm was deposited to fill that one window. This layer was alternatively permalloy or cobalt. A final deposition of gold protected the deposited permalloy or cobalt. Indium leads for measuring $V_s$ were then cold soldered into the two windows, that is, one to the gold covering the upper ferromagnetic layer and the other directly to the gold paramagnetic layer. Additional biasing leads for $I_e$ were connected to the lower permalloy layer and gold layer in planar portions away from the permalloy edge.

Figure 11:
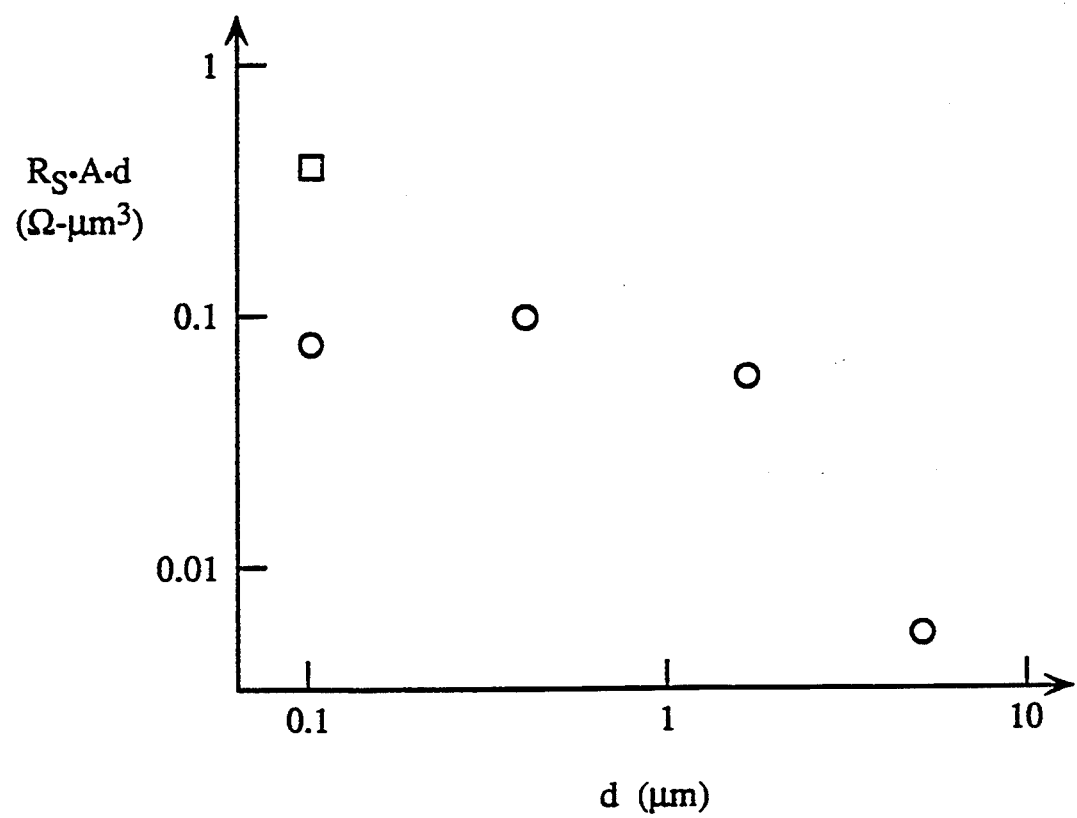
FIG. 11 is a chart of the normalized transimpedance as a function of the thickness of the paramagnetic layer.

During their measurements, the samples were biased with 0.1 to 10 mA of current $I_e$, which produced voltages $V_s$ of the order of $10^{-8}$ V. The samples were then swept with a magnetic field varying from a large negative value to a positive value around a few tens of gauss at which the lower-coercivity ferromagnetic layer changed direction of magnetization, that is, at $H_{c1}$. The two permalloy ferromagnetic layers differed in coercivity by about 4 gauss as a result of differing shape anisotropies resulting from their significantly different sizes. In the portion of the sweep prior to the change point during which the magnetization of both ferromagnetic layers were parallel, the transimpedance for the 98 nm thick paramagnetic layer was offset from zero by a few tens of microohms. After the change, the magnetic-field sweep direction was reversed and a bistable state was observed down to a negative $H_{c1}$ although there were small asymmetries. Also, the large offset in transimpedance produced in most cases a unipolar signal. The difference between the two sweep directions in the voltage within the bistable region provided a value of the transimpedance, normalized values of which are graphed in FIG. 11 as a function of the thickness d of the paramagnetic layer. The circles indicate values for the samples having permalloy for both ferromagnetic layers. These data scale over the paramagnetic thickness range of 0.1 to 1 $\mu$m as predicted by Eqn. (5). The thickness value at 5 $\mu$m indicates that the spin depth in gold is less than this thickness. The square indicates the one sample having cobalt for the second ferromagnetic layer. In this case, the two ferromagnetic materials differ in coercivity by about 6 gauss.

Although the measurements were made at reduced temperatures of 65° K. and below, the transimpedance should decrease by only a factor of three at room temperature.

Although a bipolar signal $V_s$ offers several advantages, it is nonetheless possible, as shown by the experiments, to obtain a unipolar output. The bipolar signal can be offset across a voltage source and resistor. In the illustrated embodiments, the areas to which the voltage leads 74 and 76 are connected have been symmetrically placed with respect to the edge of the paramagnetic layer. Care must be exercised in obtaining the physical symmetry in order to obtain a symmetrically bipolar signal. Intentional physical asymmetry can be used to produce a unipolar output signal.

Figure 12:
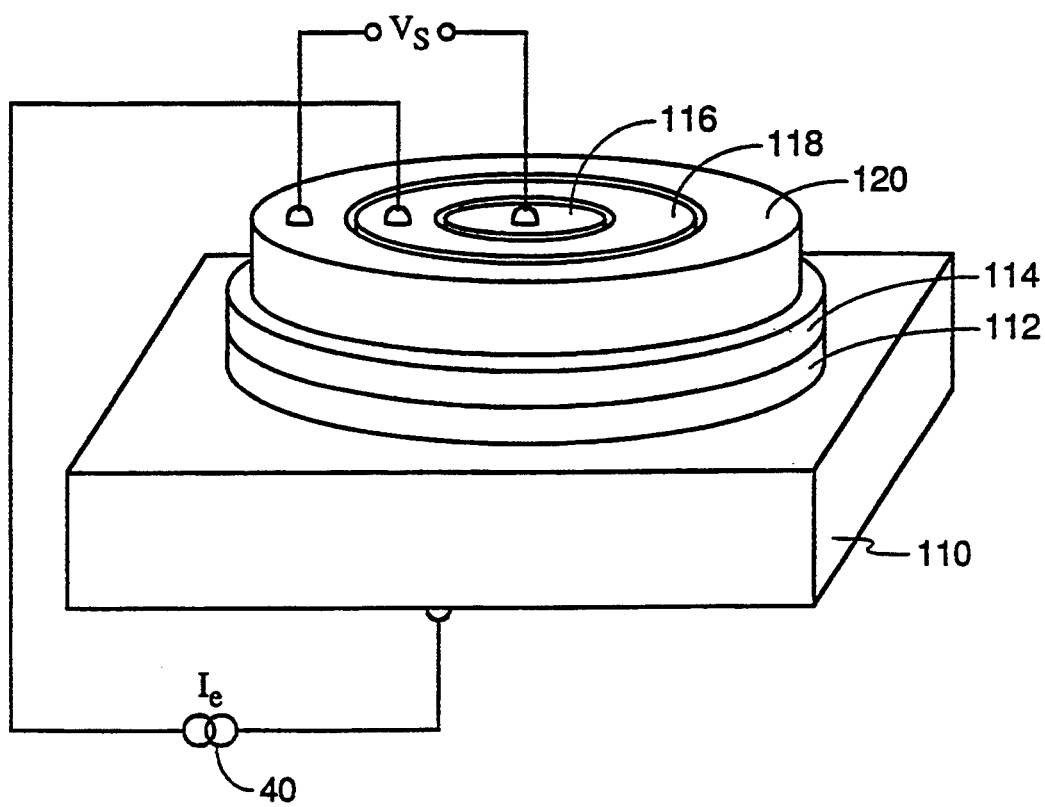
FIG. 12 is a perspective view of a circularly symmetric embodiment of the invention.

The rectangular embodiments of FIG. 8 offer the advantage of small size, but the circularly symmetric embodiment shown in perspective in FIG. 12 offers very low resistive drops. On a metallic substrate 110 is deposited and defined a circularly symmetric structure including a lower ferromagnetic disk 112 and a thin paramagnetic disk 114. On the paramagnetic disk 114 are formed three concentric structures isolated from each other except at their interface with the paramagnetic disk 114. An inner ferromagnetic disk 116 is surrounded by an inner metallic ring 118 and an outer metallic ring 120. The bias current $I_e$ is applied between the metallic substrate 110 and the inner metallic ring 118 while the voltage $V_s$ is measured between the inner ferromagnetic disk 116 and the outer metallic ring 120. A very similar configuration can be used as a current switch. The inner metallic ring 118 is eliminated, and current input through the substrate 110 is switched between the inner ferromagnetic disk 116 and the outer metallic ring 120 dependent on the value of the spin-coupled impedance, that is, the magnetization of the inner ferromagnetic disk 116 relative to that of the lower ferromagnetic disk.

Figure 13:
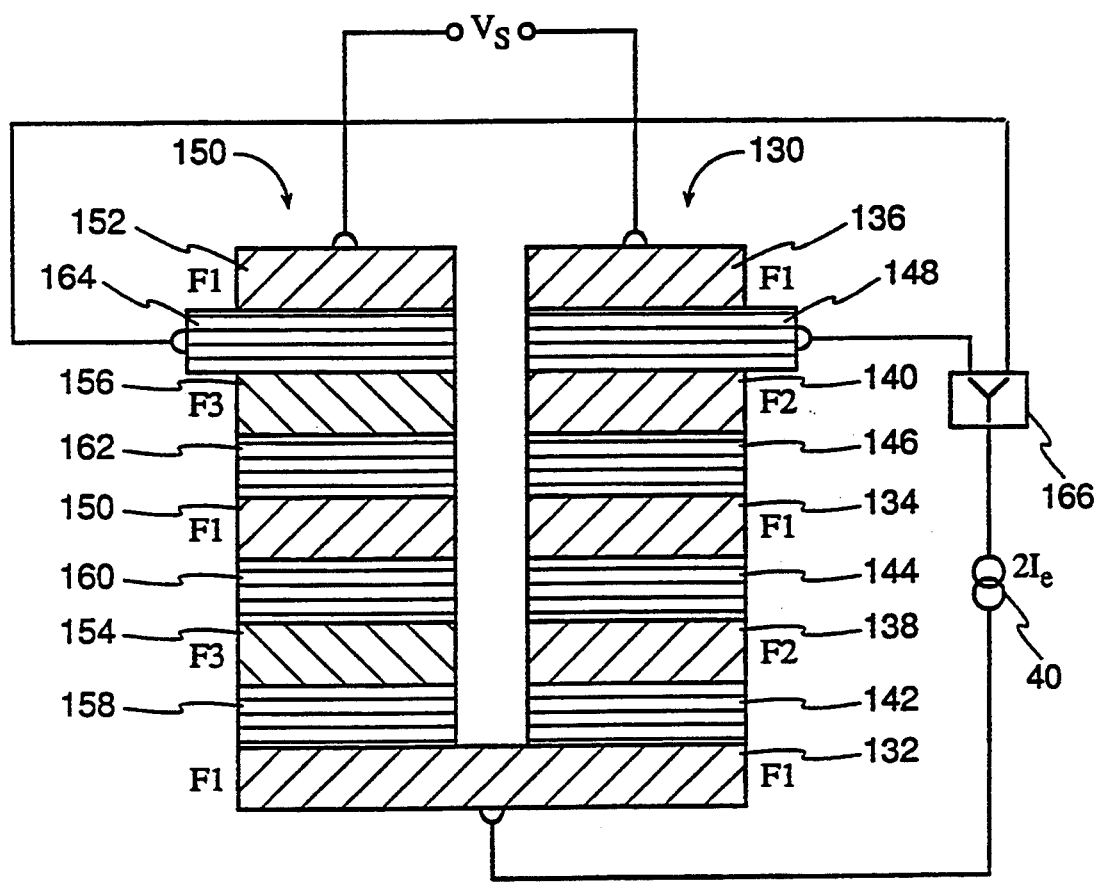
FIG. 13 is a cross-sectional view of a double-stack embodiment of the invention.

The voltage effect of the current biasing of the spins can be magnified by using a dual-stack, multi-layer structure, an embodiment of which is illustrated in cross-section in FIG. 13. The first stack 130 includes first, third, and fifth ferromagnetic layers 132, 134, and 136 of a first ferromagnetic material F1 having a positive band-structure factor $\eta_1$ and a coercivity $H_{c1}$ and second and fourth ferromagnetic layers 138 and 140 of a second ferromagnetic material F2 having a positive band-structure factor $\eta_2$ and a coercivity $H_{c2}$ that is less than $H_{c1}$. The ferromagnetic layers 132 through 140 sandwich thin paramagnetic layers 142, 144, 146, and 148. The second stack 150 has first, third, and fifth ferromagnetic layers 132, 150, and 152 of the first ferromagnetic material F1, but its second and fourth ferromagnetic layers 154 and 156 are composed of a third ferromagnetic material F3 having a negative band-structure factor $\eta_3$ and a coercivity $H_{c3}$ approximately equal to $H_{c2}$. The ferromagnetic layers 132 and 150–156 sandwich thin paramagnetic layers 158, 160, 162, and 164. The lowermost ferromagnetic layer 132 is common to the two stacks 130 and 150 so as to provide an equal reference potential. Biasing current of $I_e$ is driven through each of the stacks 130 and 150 through a current divider 166, and voltage $V_s$ is sensed across the two uppermost ferromagnetic layers 136 and 152.

In the case in which all ferromagnetic layers are magnetized in parallel with an applied magnetic field above $H_{c1}$, the first stack 130 with all positive values of the band-structure factor $\eta$ has a high electrochemical potential $V_1$ across it. But the second stack 150 with alternating values of the band-structure factor $\eta$ has a low electrochemical potential $V_2$ across it because the ferromagnetic layers are aligning with different spin sub-bands of the paramagnetic layers. In the general case of $\eta$ ferromagnetic layers, the voltage difference between the two stacks 130 and 150 is $$V_s = V_1 V_2 = 2(n-1)IR_s > 0. \tag{7}$$

On the other hand, when the applied field is reduced to $H_{c2} \approx H_{c3} < H < H_{c1}$, then the alternating ferromagnetic layers of both stacks 130 and 150 are anti-aligned. As a result, the first stack 130 has a low electrochemical potential and the second stack 150 has a high electrochemical potential. Thus, the two magnetic states are characterized by a bipolar voltage difference $\pm 2(n-1)I_eR_s$.

Figure 14:
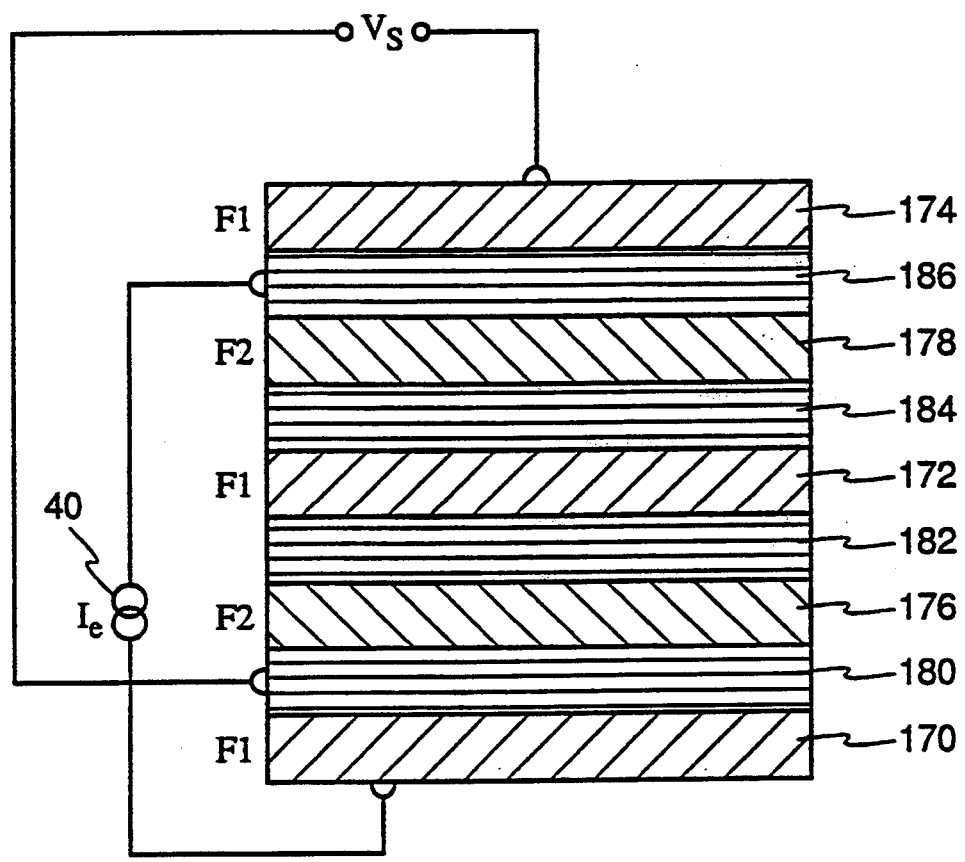
FIG. 14 is a cross-section view of a single-stack embodiment of the invention.

The additive increase in transimpedance can also be obtained using the embodiment illustrated in FIG. 14 utilizing a single multilayer stack. It includes a first, third, and fifth ferromagnetic layers 170, 172, and 174 of ferromagnetic material F1 having a coercivity $H_{c1}$ and a positive band-structure constant $\eta$ and second and fourth ferromagnetic layers 176 and 178 of ferromagnetic material F2 having a coercivity $H_{c2} < H_{c1}$ and a positive band-structure constant. The ferromagnetic layers 170–178 sandwich paramagnetic layers 180, 182, 184, and 186. The bias current $I_e$ is driven through the stack from the lowermost ferromagnetic layer 170 to the uppermost paramagnetic layer 186 while the voltage $V_s$ is sensed between the lowermost paramagnetic layer 180 and the uppermost ferromagnetic layer 174. When a large magnetic field $H > H_{c1}$ is applied so that all the ferromagnetic layers 170–178 have parallel magnetization, the parallel, unfilled ferromagnetic spin sub-bands align, resulting in a sensed voltage $V_s = -I_eR_s < 0$. On the other hand, when the applied field is reduced to $H_{c2} < H < H_{c1}$, the lower-coercivity ferromagnetic layers 176 and 178 have magnetization antiparallel to that of the higher-coercivity ferromagnetic layers 170, 172, and 174. Then, the ferromagnetic spin sub-bands on either side of a paramagnetic layer align to different ones of the paramagnetic spin sub-bands, and the sensed voltage is $V_s = 7I_eR_s > 0$. Thus, the two magnetization states produce a bipolar but nonsymmetric signal.

The miniaturization of the inventive devices described above may be limited by edge effects by which ferromagnetic material spontaneously aligns with a nearby edge. However, this effect can be advantageously used for a bilayer embodiment of the invention utilizing a single ferromagnetic and a single paramagnetic layer. If a rectangular ferromagnetic region 200, illustrated in FIG. 15, becomes very small, the ferromagnetic material spontaneously forms four triangular magnetic domains 202, 204, 206, and 208, each having a magnetization direction indicated by arrows aligned with an external edge of the ferromagnetic region 200. If the ferromagnetic region 200 is square, the domains 202–208 form equal isosceles triangles meeting at a central apex 210. If a magnetic field H is externally applied, as illustrated in FIG. 16, that domain 208 having magnetization parallel to the applied field grows while that domain 204 having antiparallel magnetization shrinks. The other two domains 200 and 206 shift without change in area, and the domains 200–208 meet in a displaced apex 212. If the magnetic field H is applied in the opposite direction, as illustrated in FIG. 17, a symmetric result is produced with an apex 214 displaced to the other side.

Figure 15:
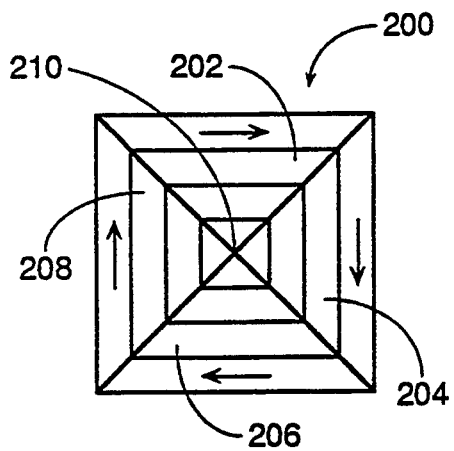
FIGS. 15–17 are plan views illustrating edge effects in small ferromagnetic regions.
Figure 16:
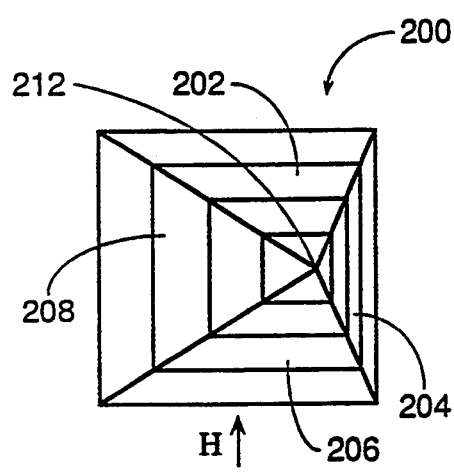
Figure 17:
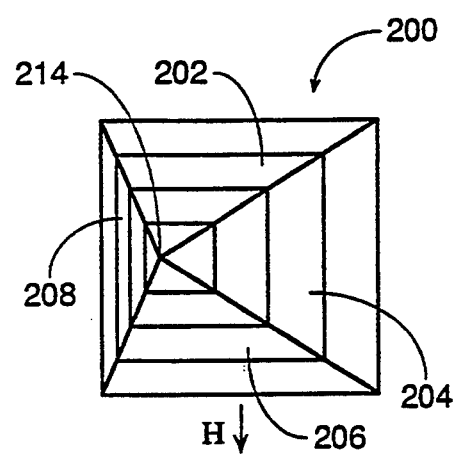
Figure 18:
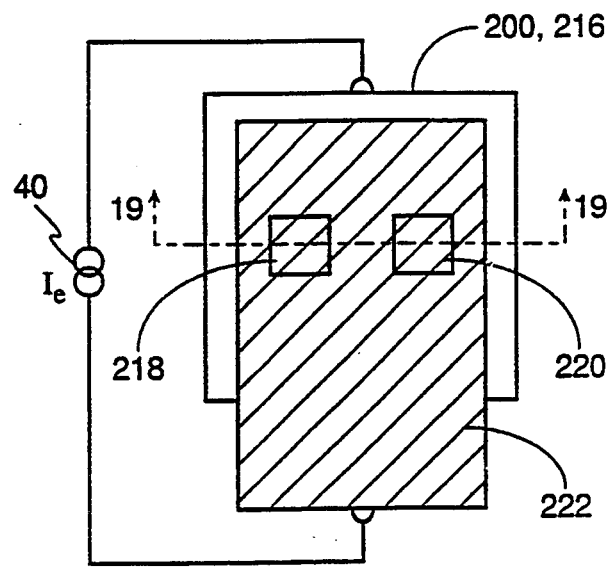
FIG. 18 is a plan view of a bilayer embodiment of the invention.
Figure 19:
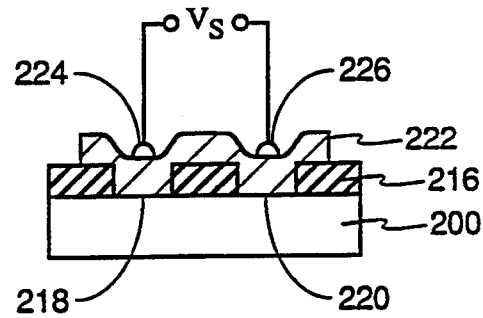
FIG. 19 is a cross-sectional view of the bilayer embodiment taken along sectional line 19—19 of FIG. 18.

The edge effects of FIG. 15–17 can be utilized in the bilayer embodiment illustrated in plan view in FIG. 18 and in cross section in FIG. 19. The ferromagnetic region 200 surrounded by a nonferromagnetic material is covered with an insulating layer 216. Windows 218 and 220 having lateral dimensions of the order of the spin depth $\delta_s$ are formed through the insulating layer 216 in areas overlying the displaced apices 212 and 214 for the intended working field $\pm H$. A paramagnetic metal layer 222 is deposited over the insulating layer 216 including the windows 218 and 220 so that the metal layer 222 directly contacts the ferromagnetic region 200 through the windows 218 and 220. Voltage contacts 224 and 226 are connected to the top of the metal layer 222 overlying the windows 218 and 220. The bias current $I_e$ is driven between the ferromagnetic region 200 and the bottom of the metal layer 222 so as to reduce the voltage sensing of resistive losses.

A current driven through a uniformly magnetized portion of the ferromagnetic region 200 will produce at the ferromagnetic/paramagnetic interface a spin-coupled resistance $R_s$ of the same value regardless of the magnetization direction. However, a current driven through a ferromagnetic portion with zero net magnetization will not produce a spin-coupled resistance. Hence, the magnetic configuration of FIG. 16 will produce a sensed voltage $V_s$ of $I_eR_s$ while the magnetic configuration of FIG. 17 will produce a sensed voltage $V_s$ of opposite polarity $-I_eR_s$. The magnetic field may be impressed upon the ferromagnetic regions by several means including the magnetic sensors described above.

The invention may be modified from the above embodiments in several ways. Other ferromagnetic materials such as Ni or Fe can be used. Semiconductors or other metals can be used for the paramagnetic layer. If the paramagnetic layer were composed of a semiconductor quantum-well structure, the very high electron density associated with the two-dimensional electron gas would provide a very high transimpedance.

The direction of up polarization illustrated in the figures was purely arbitrary. Although the maximum effect is obtained when the two ferromagnetic layers have parallel or antiparallel magnetization, non-parallel magnetizations may be used. The magnetization directions can even be perpendicular to the layer planes. The first rather than the second ferromagnetic layer can have the lower coercivity. The linear nature of the switch circuit allows the biasing current to be supplied by simple voltage sources.

The invention thus provides several novel types of electronic devices and sensors utilizing spin coupling. Its high sensitivity to magnetic field and bipolar response offer many advantages over existing devices. Nonetheless, its fabrication is relatively simple, not requiring precise lithography. The devices of the invention can be fabricated using materials such as Ni, Fe, Co, and Au, which are compatible with silicon technology.

What is claimed is:

1. A magnetic spin transistor whose operation is dependent on relative electron spin polarizations and spin-polarized chemical potentials and comprising
   a first conductive ferromagnetic layer and a second conductive ferromagnetic layer;
   a third conductive layer interposed between said first and second ferromagnetic layers, said third layer being of a material having electron levels that are not significantly affected by the electron spin so that there is little energy difference between spin sub-bands and having a thickness not substantially greater than a spin depth of electrons in said third layer and thin enough that the spin-polarized chemical potential of said first ferromagnetic layer is coupled to that of said second ferromagnetic layer via a nonequilibrium spin population in said third layer;
   means for passing a biasing current from said first ferromagnetic layer to said third conductive layer;
   means for detecting a resultant voltage between said second ferromagnetic layer and said third conductive layer; and
   means for switching only one of said ferromagnetic layers between two opposed states of magnetization.

2. A magnetic spin transistor as recited in claim 1, wherein said voltage detecting means comprises a first lead electrically connected to said second ferromagnetic layer and a second lead connected to a principal surface of said third layer opposite said first ferromagnetic layer.

3. A magnetic spin transistor as recited in claim 1, comprising a repeating structure of a plurality of alternating ones of said first and second layers interposed by a plurality of said third layers.

4. A magnetic spin transistor as recited in claim 1, wherein one of said ferromagnetic layers has a first coercivity lower than a second coercivity of the other of said ferromagnetic layers.

5. A magnetic spin transistor as recited in claim 4, wherein said one ferromagnetic layer is patterned to a first area smaller than a second area to which said other ferromagnetic layer is patterned.

6. A magnetic spin transistor as recited in claim 4, wherein said first, second, and third layers each have a lower surface edge aligned in a common plane and said switching means comprises a recording medium recorded with a serial train of magnetic domains; and means for imparting relative motion between said recording medium and said lower surface edges.

7. A magnetic spin transistor as recited in claim 6, wherein said domains exert a magnetic field on said first, second, and third layers falling between said first and second coercivities.

8. A magnetic spin transistor whose operation is dependent on relative electron spin polarizations and spin-polarized chemical potentials and comprising a first conductive ferromagnetic layer and a second conductive ferromagnetic layer;

a third conductive layer interposed between said first and second ferromagnetic layers, said third layer being of a material having electron levels that are not significantly affected by the electron spin so that there is little energy difference between spin sub-bands and having a thickness not substantially greater than a spin depth of electrons in said third layer and thin enough that the spin-polarized chemical potential of said first ferromagnetic layer is coupled to that of said second ferromagnetic layer via a nonequilibrium spin population in said third layer; and means for switching only one of said ferromagnetic layers between two opposed states of magnetization, and wherein said first and second ferromagnetic layers and said third layer are circularly symmetric about an axis and further comprising first and second conductive layers circularly symmetric about said axis and formed on said third layer;

an electrical bias source connected across said first ferromagnetic layer and one of said conductive layers disposed laterally between said second ferromagnetic layer and the other of said conductive layers; and voltage detecting means for detecting a voltage between said second ferromagnetic layer and said other conductive layer.

9. A magnetic transistor whose operation is dependent on relative electron spin polarizations and comprising a ferromagnetic region having a sufficiently small area that a ferromagnetic wedge effect is manifested along the edges thereof and extending to a substantial central portion thereof;

a first and a second region formed over respective portions of said ferromagnetic region, said first and second regions being of a material having electron levels that are not significantly affected by the electron spin so that there is little energy difference between sub-bands and having lateral dimensions of the order of a spin depth;

means for driving a biasing current through respective interfaces between said first and second regions and said ferromagnetic region; and means for sensing a voltage between said first and second regions.

10. A magnetic transistor as recited in claim 9, further comprising means for imposing a first magnetic state and a second magnetic state upon said ferromagnetic region, said first magnetic state comprising a first substantially uniformly magnetized area underlying said first region and a second area of substantially zero net magnetization underlying said second region, said second magnetic state comprising a third substantially uniformly magnetized area underlying said second region and a fourth area of substantially zero net magnetization underlying said first region.

11. A magnetic spin transistor whose operation is dependent on relative electron spin polarizations and spin-polarized chemical potentials and comprising a first repeating structure of a plurality of alternating first conductive ferromagnetic layers and second conductive ferromagnetic layers with third conductive layers interposed in said repeating structure between said first and second layers, said third layers being of a material having electron levels that are not significantly affected by the electron spin so that there is little energy difference between spin sub-bands and having a thickness not substantially greater than a spin depth of electrons in said third layer and thin enough that the spin-polarized chemical potential of said first ferromagnetic layers is coupled to that of said second ferromagnetic layers via a nonequilibrium spin population in said third layers; and a second repeating structure of a plurality of alternating fourth conductive ferromagnetic layers and fifth conductive ferromagnetic layers with sixth conductive layers interposed in said repeating structure between said fourth and fifth layers, said sixth layers being of a material having electron levels that are not significantly affected by the electron spin so that there is little energy difference between spin sub-bands and having a thickness not substantially greater than a spin depth of electrons in said sixth layer and thin enough that the spin polarized chemical potential of said fourth ferromagnetic layers is coupled to that of said fifth ferromagnetic layers via a non equilibrium spin population in said sixth layers;

wherein a sign of a band-structure factor denotes whether charge transport across an interface between a respective ferromagnetic layer and third or sixth layer is dominated by majority spins or by minority spins and wherein said first and second ferromagnetic layers are characterized by respective band-structure factors of a first sign, said fourth ferromagnetic layers are characterized by a band-structure factor of said first sign, and said fifth ferromagnetic layers are characterized by a band-structure factor of a second sign.

12. A magnetic spin transistor as recited in claim 11 further comprising means for switching one of said first and second ferromagnetic layers and one of said fourth and fifth ferromagnetic layers between two states of opposed magnetization.

13. A magnetic spin transistor as recited in claim 12 wherein the lowermost ferromagnetic layer of said first and second repeating structures is common so as to provide an equal reference potential.

14. A magnetic spin transistor as recited in claim 13 further comprising means for driving bias current through said first and second repeating structures and means for sensing a voltage across the uppermost ferromagnetic layers of said first and second repeating structures.

15. A magnetic spin transistor whose operation is dependent on relative electron spin polarizations and spin-polarized chemical potentials and comprising a first conductive ferromagnetic layer and a second conductive ferromagnetic layer, one of said ferromagnetic layers having a first coercivity lower than a second coercivity of the other of said ferromagnetic layers and said one ferromagnetic layer being patterned to a first area smaller than a second area to which said other ferromagnetic layer is patterned;

a third conductive layer interposed between said first and second layers, said third layer being of a material having electron levels that are not significantly affected by the electron spin so that there is little energy difference between spin sub-bands and having a thickness not substantially greater than a spin depth of electrons in said third layer and thin enough that the spin-polarized chemical potential of said first ferromagnetic layer is coupled to that of said second ferromagnetic layer via a non-equilibrium spin population in said third layer; and means for switching only one of said ferromagnetic layers between two opposed states of magnetization, said switching means comprising a first current path passing over said first area of said one ferromagnetic layer and selectively producing a magnetic field in said one ferromagnetic layer.

16. A magnetic spin transistor as recited in claim 15, wherein said switching means further comprises a second current path passing over said first area of said one ferromagnetic layer and selectively producing a magnetic field in said one ferromagnetic layer; and two bipolar current sources respectively connected to said first and second current paths.

17. A magnetic spin transistor whose operation is dependent on relative electron spin polarizations and comprising a first conductive ferromagnetic member;

a second metallic base member having a thickness;

a third conductive member having an upper surface and contacting at its two end portions said first ferromagnetic member and said second base member, said third member being of a material having electron levels that are not significantly affected by the electron spin and the thickness of said third member being less than or of the order of the spin depth $$\delta_s = \sqrt{2DT_2}$$

where D is the electronic diffusion coefficient and $T_2$ is its spin relaxation time, and a fourth metallic surface member and a fifth conductive ferromagnetic surface member, both said fourth and fifth members contacting the upper surface of said third member where said upper surface of said third member is directly over said first ferromagnetic member.

18. A magnetic spin transistor as recited in claim 17, further comprising electrical leads individually connected to said first, second, fourth and fifth members.

* * * * *